United States Patent
Lim et al.

(10) Patent No.: US 9,866,013 B2
(45) Date of Patent: Jan. 9, 2018

(54) CURRENT LIMITING DEVICE

(71) Applicant: Soongsil University Research Consortium Techno-Park, Seoul (KR)

(72) Inventors: Sung Hun Lim, Seoul (KR); Jae Chul Kim, Gwangmyeong (KR); Jin Seok Kim, Seoul (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 286 days.

(21) Appl. No.: 14/892,654

(22) PCT Filed: May 20, 2014

(86) PCT No.: PCT/KR2014/004497
§ 371 (c)(1),
(2) Date: Nov. 20, 2015

(87) PCT Pub. No.: WO2014/189258
PCT Pub. Date: Nov. 27, 2014

(65) Prior Publication Data
US 2016/0308351 A1    Oct. 20, 2016

(30) Foreign Application Priority Data

May 20, 2013 (KR) .................. 10-2013-0056642

(51) Int. Cl.
*H01H 9/30* (2006.01)
*H02H 9/02* (2006.01)
(Continued)

(52) U.S. Cl.
CPC ............ *H02H 9/023* (2013.01); *H01L 39/16* (2013.01); *H01H 9/541* (2013.01); *H01H 9/542* (2013.01); *H02H 3/025* (2013.01); *Y02E 40/69* (2013.01)

(58) Field of Classification Search
USPC ..................... 361/2–13, 93.7–93.9
See application file for complete search history.

(56) References Cited

U.S. PATENT DOCUMENTS

| | | | | |
|---|---|---|---|---|
| 8,837,093 B2* | 9/2014 | Panousis | ............. | H01H 33/596 361/13 |
| 2007/0139832 A1 | 6/2007 | Lee | | |
| 2012/0299393 A1* | 11/2012 | Hafner | .................. | H01H 9/542 307/113 |

FOREIGN PATENT DOCUMENTS

| JP | 60-105123 A | 6/1985 |
|---|---|---|
| JP | 61-116922 A | 6/1986 |

(Continued)

OTHER PUBLICATIONS

International Search Report for PCT/KR2014/004497 dated Jul. 29, 2014.

(Continued)

*Primary Examiner* — Danny Nguyen
(74) *Attorney, Agent, or Firm* — Pearne & Gordon LLP (57) ABSTRACT

A current limiting device is provided. To elaborate, the device may include: a first current limiting unit configured to limit an electric current equal to or higher than a first threshold value applied thereto; a second current limiting unit configured to limit an electric current equal to or higher than a second threshold value applied thereto; and a passive element unit connected to both ends of the first current limiting unit, and including a first passive element and a second passive element connected in series.

9 Claims, 5 Drawing Sheets

(51) Int. Cl.
*H01L 39/16* (2006.01)
*H02H 3/02* (2006.01)
*H01H 9/54* (2006.01)

(56) References Cited

FOREIGN PATENT DOCUMENTS

| | | |
|---|---|---|
| JP | 04-207923 A | 7/1992 |
| JP | 2006-278135 A | 10/2006 |
| JP | 2008-270171 A | 11/2008 |
| KR | 10-0780706 B1 | 11/2007 |
| KR | 10-2008-0007911 A | 1/2008 |
| KR | 10-2008-0032920 A | 4/2008 |
| KR | 10-2011-0002749 A | 1/2011 |

OTHER PUBLICATIONS

Supplementary European Search Report for EP 14 80 0863 dated Jan. 17, 2017.

* cited by examiner

CURRENT LIMITING DEVICE

TECHNICAL FIELD

The embodiments described herein pertain generally to a current limiting device.

BACKGROUND

In an electrical power device or circuit, a continuous rated current flows in a normal state. If, however, there occurs a problem in the electrical power device or circuit, or if a fault current beyond a tolerance range is flown to the electrical power device or circuit, major components within the electrical power device or circuit may suffer damages due to the fault current.

A current limiting device has been developed to prevent generation of such a fault current. The current limiting device is connected to a track circuit of the electrical power device or circuit and is capable of adjusting an electric current. Particularly, many researches have been actively conducted on a superconducting current limiting device using a superconductor. The super conductor has an electrical resistance substantially close to zero (0) at a very low temperature, and the electrical resistance thereof increases rapidly with a rise of the temperature.

If, however, a fault current over a certain level is applied to the superconducting current limiting device, there is a risk that even the superconducting element is damaged. Further, if the fault current over a certain level is applied, the electrical resistance of the superconducting element may become close to infinity and has adverse influence on devices to which the electric current needs to be applied continuously for normal operations. In view of this problem, there have been conducted many researches upon a method of controlling the fault current by adjusting the number of superconducting elements being operated or a flow path of the electric current based on the magnitude of the fault current, by using a layout of the superconducting elements and a switching element.

In this regard, Korean Patent Publication No. 2011-0002749 (entitled "Method for improvement of recovery characteristics using a trigger of superconductor in a superconducting fault current limiter with magnetic coupling of two coils") discloses a method of controlling a fault current by improving recovery characteristics of a superconducting current limiter through magnetic coupling of two coils.

DISCLOSURE OF THE INVENTION

Problems to be Solved by the Invention

Example embodiments are conceived to solve the aforementioned problems and provide a current limiting device capable of protecting components within the current limiting device itself as well as protecting a device or a circuit intended to be protected by the current limiting device, by varying, depending on a magnitude of an applied electric current, a path through which the applied electric current flows.

However, the problems sought to be solved by the present disclosure are not limited to the above description and other problems can be clearly understood by those skilled in the art from the following description.

Means for Solving the Problems

In the present disclosure, there is provided a current limiting device. The device may include: a first current limiting unit configured to limit an electric current equal to or higher than a first threshold value applied thereto; a second current limiting unit configured to limit an electric current equal to or higher than a second threshold value applied thereto; and a passive element unit connected to both ends of the first current limiting unit, and including a first passive element and a second passive element connected in series.

Herein, the second current limiting unit is connected to the first passive element in parallel, an impedance value of the first current limiting unit and an impedance value of the second current limiting unit are changed by an electric current applied thereto, the applied electric current flows through the first current limiting unit when the applied electric current is less than the first threshold value, the applied electric current flows through the second current limiting unit and the second passive element when the applied electric current is equal to or higher than the first threshold value and less than the second threshold value, and the applied electric current flows through the passive element unit when the applied electric current is equal to or higher than the second threshold value.

Effect of the Invention

According to the example embodiments, the path through which the electric current flows can be varied based on the magnitude of the fault current. Therefore, it is possible to protect components within the current limiting device from a fault current effectively.

Furthermore, according to the example embodiments, by preventing the fault current from being applied to another device, that device can be prevented from being damaged, and an electric current within a normal range can be continuously applied to the device.

MODE FOR CARRYING OUT THE INVENTION

Hereinafter, example embodiments will be described in detail so that inventive concept may be readily implemented by those skilled in the art. However, it is to be noted that the present disclosure is not limited to the example embodiments and examples but can be realized in various other ways. In drawings, parts not directly relevant to the description are omitted to enhance the clarity of the drawings, and like reference numerals denote like parts through the whole document.

Through the whole document, the terms "connected to" or "coupled to" are used to designate a connection or coupling of one element to another element and include both a case where an element is "directly connected or coupled to" another element and a case where an element is "electronically connected or coupled to" another element via still another element. Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Figure 1:
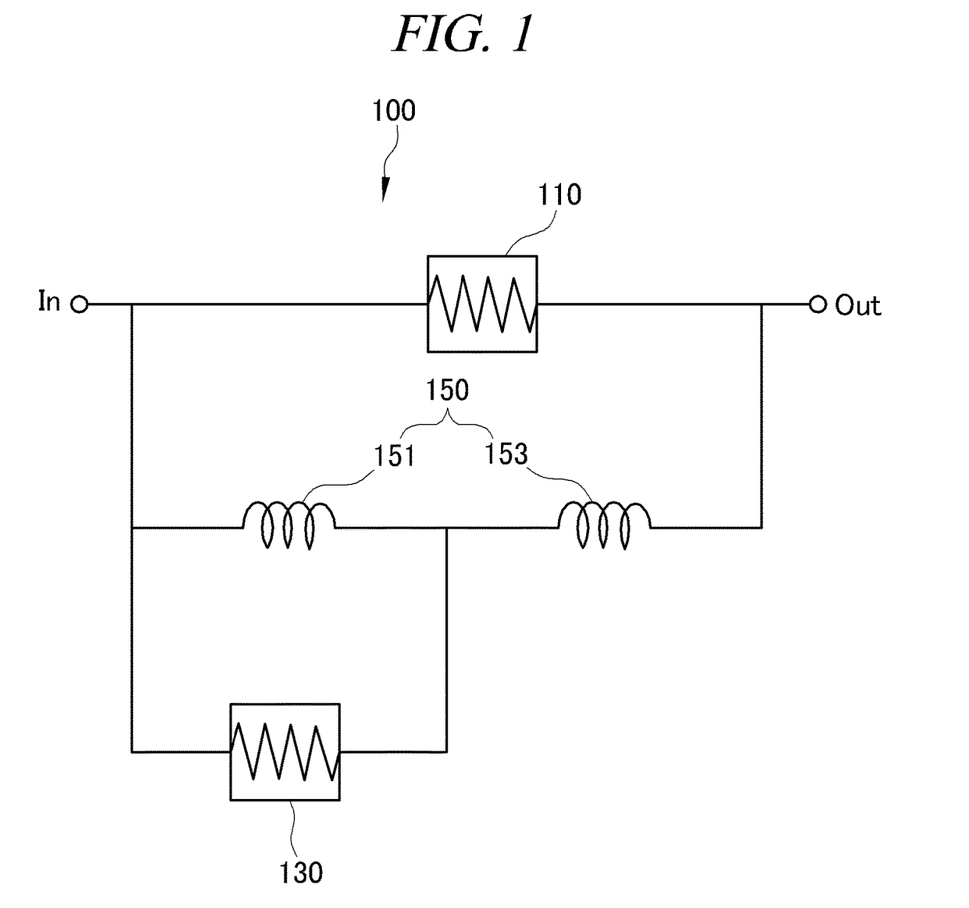
FIG. 1 is a diagram for describing a current limiting device according to an example embodiment.

FIG. 1 is a diagram for describing a current limiting device according to an example embodiment.

As depicted in FIG. 1, the current limiting device 100 includes a first current limiting unit 110, a second current limiting unit 130 and a passive element unit 150.

The first current limiting unit 110 is configured to limit an electric current when a fault current over a first threshold value is applied. An initial impedance value of the first current limiting unit 110 is smaller than an impedance value of a first passive element to be described later.

The first current limiting unit 110 includes a first switching element (not shown); and a first current detecting element (not shown) connected to the first switching element in series. By way of example, the first switching element may be switched ON or OFF based on an electric current value detected by the first current detecting element so that the first current limiting unit 110 can limit the electric current. Alternatively, the first current limiting unit 110 may include a first superconducting element (not shown).

The second current limiting unit 130 is configured to limit an electric current when a fault current over a second threshold value is applied. Here, an initial impedance value of the second current limiting unit 130 is smaller than an impedance value of the first passive element to be described later, and the second current limiting unit 130 is connected in parallel to the first passive element. The second current limiting unit 130 includes a second switching element (not shown); and a second current detecting element (not shown) connected to the second switching element in series. By way of example, the second switching element may be switched ON or OFF based on an electric current value detected by the second current detecting element so that the second current limiting unit 130 can limit the electric current. Alternatively, the second current limiting unit 130 may include a second superconducting element (not shown).

The passive element unit 150 is connected in parallel to both ends of the first current limiting unit 110, and includes a first passive element 151 and a second passive element 153 which are connected in series. For example, each of the first passive element 151 and the second passive element 153 may be composed of a combination of one or more resistor R, one or more coils L and one or more capacitors C. Here, since an impedance value of the first passive element 1151 composed of the R-L-C combination is larger than the initial impedance value of the first current limiting unit 110 and the initial impedance value of the second current limiting unit 130, an applied electric current can be flown through the first current limiting unit 110 in ordinary (normal) times. In addition, the impedance values of the first and second passive elements 151 and 152 may be set to fixed values in advance depending on the intention of a designer or the purpose of usage.

Operational characteristics of the individual components within the above-described current limiting device 100 depending on the magnitude of the fault current will be elaborated later.

Figure 2A:
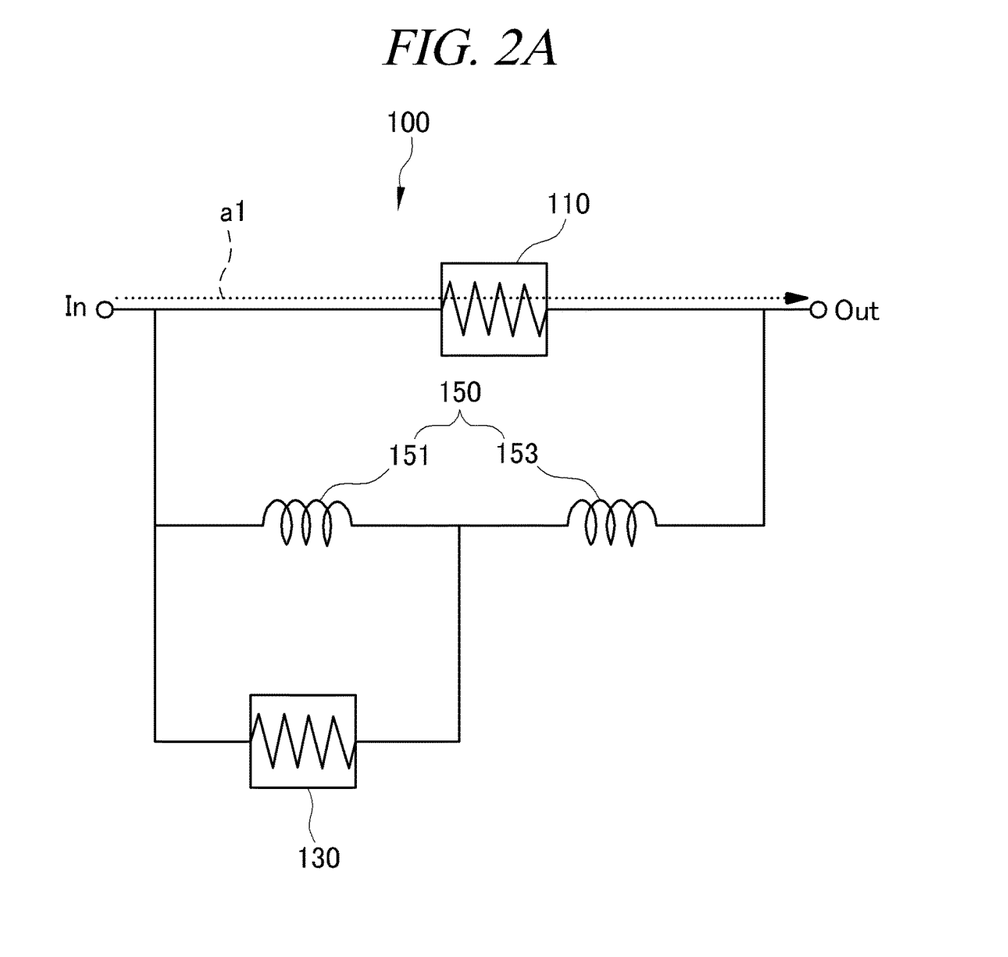
FIG. 2A to FIG. 2C are diagrams for describing a path through which an electric current flows in the current limiting device according to the example embodiment.
Figure 2B:
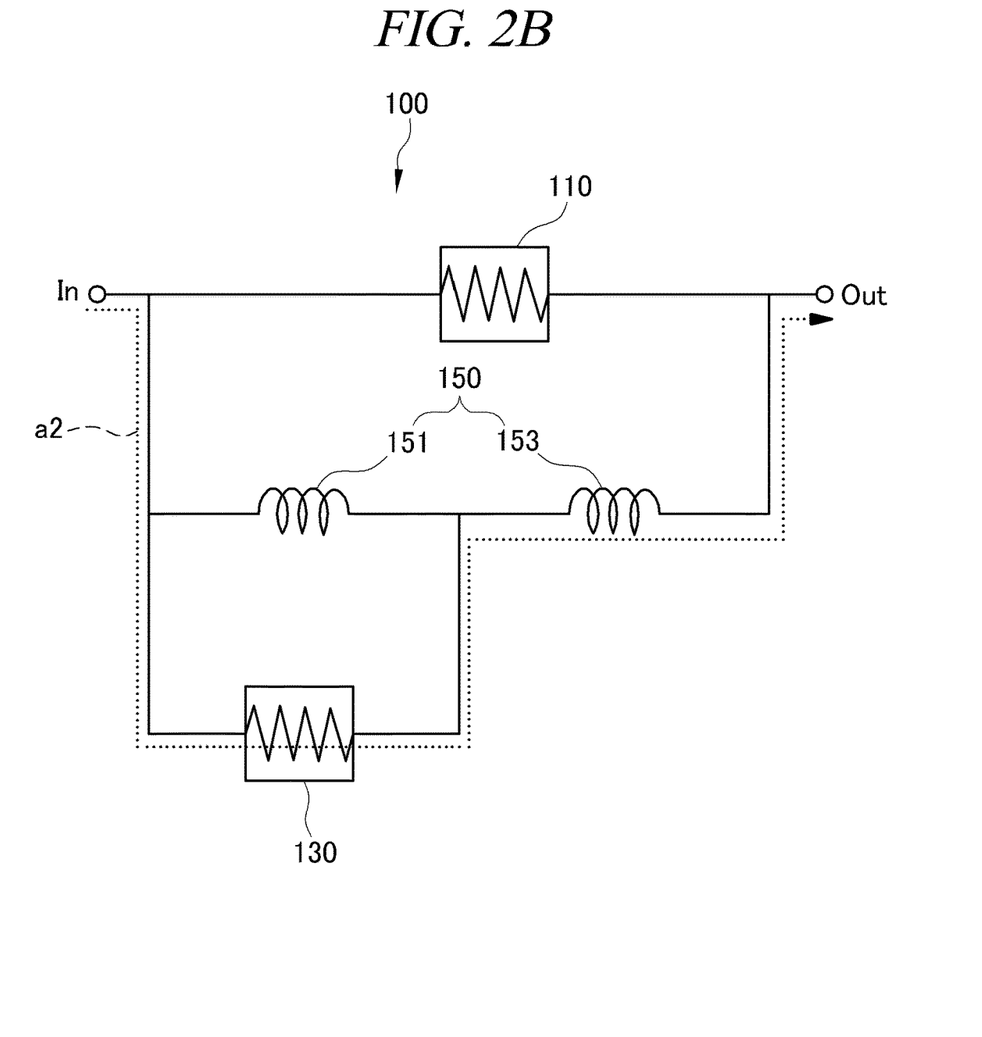
Figure 2C:
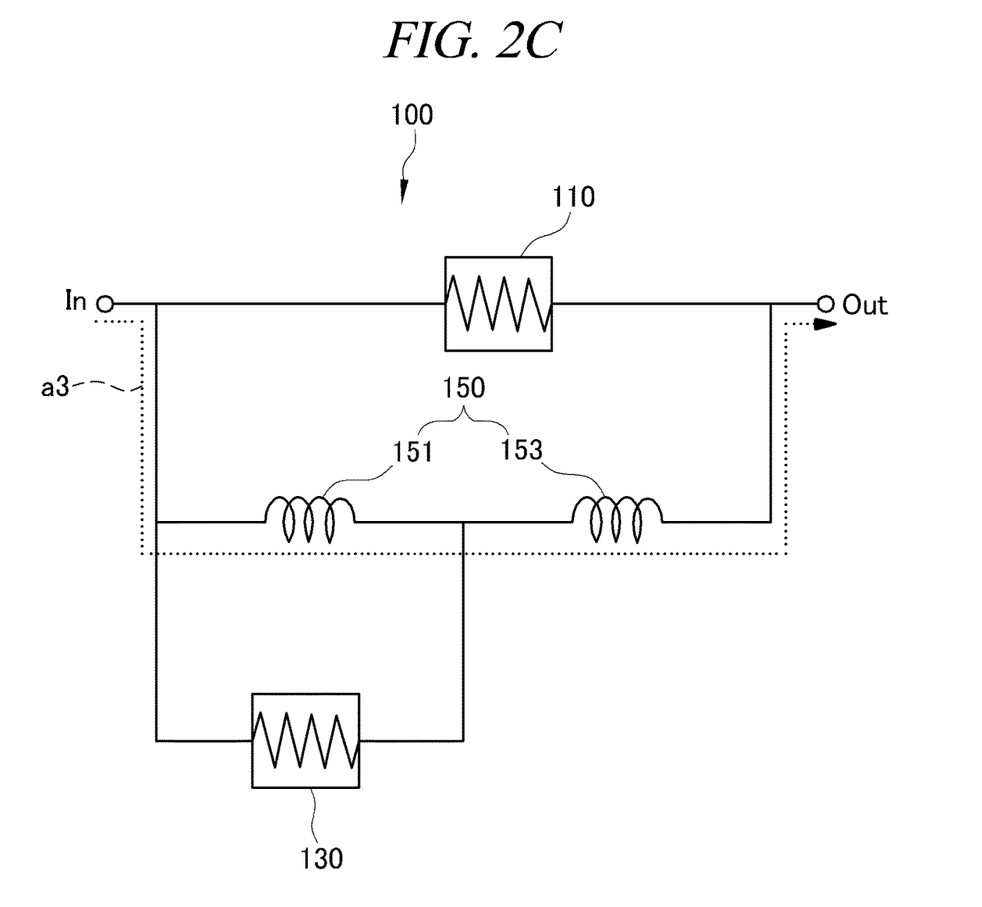

FIG. 2A to FIG. 2C are diagrams for describing a path through which an electric current flows within the current limiting device according to the example embodiment.

Referring to FIG. 2A, an electric current path in a case where an electric current less than a first threshold value is applied in the current limiting device 100 will be explained. Here, the first threshold value may be a preset electric current value at the moment when the impedance value of the first current limiting unit 110 increases rapidly and becomes infinite. Further, the first threshold value may be variable depending on the intention of the designer or the purpose of usage.

As one example, description will be provided for a case where each of the first current limiting unit 110 and the second current limiting unit 130 includes a switching element and an electric current detecting element. The first switching element (not shown) of the first electric current limiting unit 110 may be initially in an ON state, and the first electric current detecting element (not shown) connected to the first switching element detects whether the applied electric current is an ordinary electric current less than the first threshold value. A detection result is sent to the first current limiting unit 110, and the first current limiting unit 110 turns an ON/OFF state of the first switching element based on the detection result. Accordingly, when the ordinary electric current less than the first threshold value is applied, the first switching element may be in the ON state. At this time, if the first switching element is ON, the ordinary electric current flows into a path a1 through the first current limiting unit 110.

Further, as another example, description will be provided for a case where each of the first current limiting unit 110 and the second current limiting unit 130 includes a superconducting element. If an ordinary electric current less than the first threshold value is applied, the first current limiting unit 110 allows the ordinary electric current to pass through the first superconducting element (not shown). Here, the first threshold value is an electric current value at which resistance of the first superconducting element increases rapidly and becomes infinite. Thus, when the ordinary electric current less than the first threshold value is applied, the resistance of the first superconducting element is kept below a preset level. Further, when the ordinary electric current less than the first threshold value is applied, an impedance value of the first superconducting element is smaller than the impedance value of the first passive element 151. Accordingly, the ordinary electric current flows through the path a1 in FIG. 2A.

Referring to FIG. 2B, an electric current path in a case where an electric current equal to or higher than the first threshold value and less than a second threshold value is applied in the current limiting device 100 will be elaborated. Here, the second threshold value is a value larger than the first threshold value, and is a preset electric current value at the moment when the impedance value of the second current limiting unit 130 increases rapidly and becomes infinite. Further, the second threshold value may be variable depending on the intention of the designer or the purpose of usage.

By way of one example, description will be provided for the case where each of the first current limiting unit 110 and the second current limiting unit 130 includes the switching element and the current detecting element. If a fault current equal to or higher than the first threshold value and less than the second threshold value is applied, the first current limiting unit 110 turns the first switching element into an OFF state. Meanwhile, if the fault current equal to or higher than the first threshold value and less than the second threshold value is applied, the second current limiting unit 130 turns the second switching element into an ON state. That is, if the applied electric current is detected to be a fault current equal to or higher than the first threshold value and less than the second threshold value by the second current detecting element connected to the second switching element in series, the second current limiting unit 130 that has received the detection result turns the second switching element into the ON state from an OFF state. At this time, since the first current limiting unit 110 is OFF, the applied electric current is made to flow through a path other than the path a1 in FIG. 2A. Here, since the impedance value of the first passive element 151 is larger than the impedance value of the second current limiting unit 130 and the second current limiting unit 130 is connected only to the first passive element 151 in parallel, the applied electric current is made to flow through a path a2 in which the electric current passes through the second current limiting unit 130 and the second passive element 153 in sequence.

By way of another example, description will be provided for the case where each of the first current limiting unit 110 and the second current limiting unit 130 includes the superconducting element. If a fault current equal to or higher than the first threshold value and less than the second threshold value is applied, the first current limiting unit 110 blocks the first superconducting element from the fault current. Meanwhile, if the fault current equal to or higher than the first threshold value and less than the second threshold value is applied, the second current limiting unit 130 allows the fault current to pass through the second superconducting element and the second passive element 153. Here, since the electric current equal to or higher than the first threshold value and less than the second threshold value has an electric current value that allows the resistance of the first superconducting elements to become infinite and the resistance of the second superconducting element to be maintained below a preset level, the resistance of the first current limiting unit 110 becomes infinite, and the applied electric current cannot flow through the first current limiting unit 110. Accordingly, the applied electric current is made to pass through a path other than the path al in FIG. 2A. At this time, since the impedance value of the first passive element 151 is larger than the impedance value of the second current limiting unit 130, the applied electric current is made to flow through the path a2 in which the electric current passes through the second current limiting unit 130 and the second passive element 153 in sequence.

Referring to FIG. 2C, an electric current path in a case where an electric current equal to or higher than the second threshold value is applied in the current limiting device 100 will be elaborated.

As one example, description will be provided for the case where each of the first current limiting unit 110 and the second current limiting unit 130 includes the switching element and the current detecting element. If a fault current equal to or higher than the second threshold value is applied, the first current limiting unit 110 turns the first switching element into an OFF state. Further, if the fault current equal to or higher than the second threshold value is applied, the second current limiting unit 130 also turns the second switching element into an OFF state. That is, if the applied electric current is detected to be a fault current equal to or higher than the second threshold value by the first current detecting element connected to the first switching element in series and by the second current detecting element connected to the second switching element in series, the first current limiting unit 110 and the second current limiting unit 130 that have received the detection result turn the first switching element and the second switching element into the OFF state from an ON state, respectively. In this case, the paths through the first current limiting unit 110 and the second current limiting unit 130 are all blocked, and the applied electric current is made to flow through a path a3 in which it passes through the passive element unit 150.

Further, as another example, description will be provided for the case where each of the first current limiting unit 110 and the second current limiting unit 130 includes the superconducting element. If a fault current equal to or higher than the second threshold value is applied, the first current limiting unit 110 blocks the first superconducting element from the fault current. If the fault current equal to or higher than the second threshold value is applied, the second current limiting unit 130 also blocks the second superconducting element from the fault current. In this case, since the paths through the first current limiting unit 110 and the second current limiting unit 130 are all blocked, the applied electric current is made to flow through the path a3 in which it passes through the passive element unit 150.

As stated above, in case that the first current limiting unit 110 and the second current limiting unit 130 include the superconducting elements, the resistance of the superconducting elements increase rapidly to infinity if an electric current equal to or higher than a threshold value is applied. Accordingly, even if the first current limiting unit 110 and the second current limiting unit do not perform any blocking operations, the electric current cannot be flown thereto. However, the first current limiting unit 110 and the second current limiting unit 130 are capable of performing blocking operations through the switches respectively included therein, so that it is possible to prevent a damage on the superconducting elements due to the application of an over current.

Furthermore, the above-description has been provided for the two discrete cases: the one where each of the first current limiting unit 110 and the second current limiting unit 130 includes the switching element and the current detecting element, and the other where each of them includes the superconducting element. However, the first current limiting unit 110 and the second current limiting unit 130 may have the same operational characteristics in both cases. Besides, each of the first current limiting unit 110 and the second current limiting unit 130 may be configured to include the switching device and the current detecting element as well as the superconducting element. In such a case, they also have the same operational characteristics as those stated in the aforementioned two cases.

Figure 3:
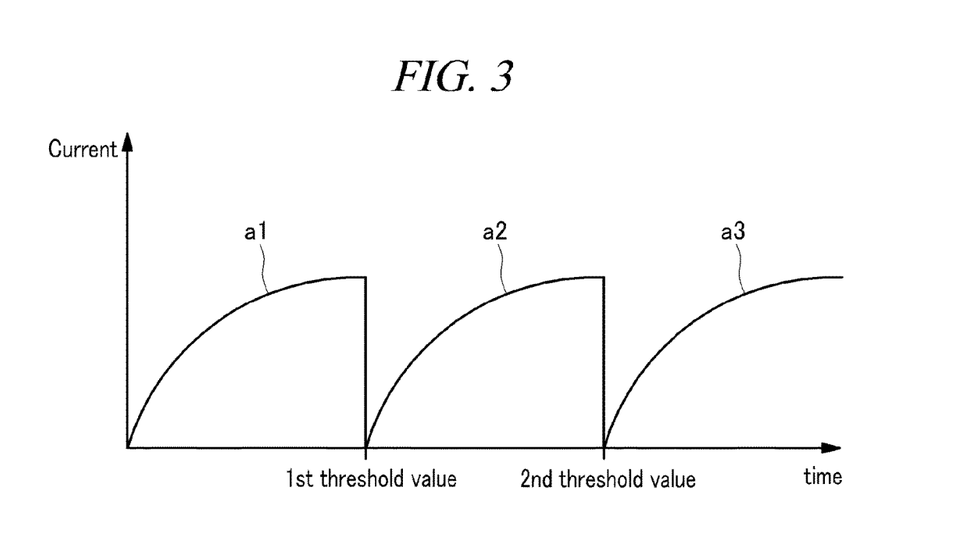
FIG. 3 present a diagram for describing a variation in an electric current that flows in individual components within the current limiting device with a lapse of time.

FIG. 3 is a diagram for describing a variation in an electric current flown to the individual components within the current limiting device with a lapse of time according to the example embodiment.

Referring to FIG. 3, an operational characteristic of the above-described current limiting unit 100 and an electric current applied to the first current limiting unit 110, the second current limiting unit 130 and the passive element unit 150 according to this operational characteristic will now be discussed. In FIG. 3, a horizontal axis represents a lapse of time, and a vertical axis indicates a variation in the magnitude of the electric current. Here, it is assumed that the electric current applied to the current limiting unit 100 keeps increasing. The horizontal axis of FIG. 3 can be divided into three sections: less than the first threshold value, equal to or higher than the first threshold value and less than the second threshold value, and equal to or higher than the second threshold value.

First, within the range where the electric current is less than the first threshold value, since the initial impedance value of the first current limiting unit 110 is smaller than the impedance value of the first passive element 151, the electric current is allowed to flow through the path in which the electric current passes through the first current limiting unit 110 (i.e., the path a1 of FIG. 2A). That is, within the range less than the first threshold value, the electric current is made to flow through the path a1 due to the initial impedance of the first current limiting unit 110. At this time, the electric current applied to the first superconducting element of the first current limiting unit 110 keeps increasing and becomes zero at the moment it reaches the first threshold value. After the first threshold value, the path a1 is blocked.

Within the range where the electric current is equal to or higher than the first threshold value and less than the second threshold value, since the impedance value of the first current limiting unit 110 is infinite and the impedance value of the second current limiting unit 130 is smaller than the impedance value of the first passive element 151, the electric current is allowed to flow through the path a2 of FIG. 2B. That is, within the range equal to or higher than the first threshold value and less than the second threshold value, the electric current is made to flow through the path a2 based on the initial impedance of the second current limiting unit 130. At this time, the electric current applied to the second superconducting element of the second current limiting unit 130 keeps increasing and becomes zero at the moment it reaches the second threshold value. After the second threshold value, both the path a1 and the path a2 are blocked.

Within the range equal to or higher than the second threshold value, since the impedance values of the first current limiting unit 110 and the second current limiting unit 130 are both infinite, the electric current is made to flow through the path a3 of FIG. 2C in which the electric current passes through the passive element unit 150 including the first passive element 151 and the second passive element 153. That is, within the range equal to or higher than the second threshold value, the electric current is made to flow through the path a3 based on the impedance values of the first current limiting unit 110 and the second current limiting unit 130. At this time, the electric current applied to the passive element unit 150 increases up to a limiting current of the passive element unit 150.

As stated above, the current limiting device 100 according to the example embodiment is capable of changing the path through which the electric current flows based on the magnitude of the fault current. Thus, it is possible to protect a target object intended to be protected by the current limiting device 100, while protecting the components within the current limiting device 100 from the fault current as well.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

We claim:

1. A current limiting device, comprising:
   a first current limiting unit configured to limit an electric current equal to or higher than a first threshold value applied thereto;
   a second current limiting unit configured to limit an electric current equal to or higher than a second threshold value applied thereto; and
   a passive element unit connected to both ends of the first current limiting unit, and including a first passive element and a second passive element connected in series,
   wherein the second current limiting unit is connected to the first passive element in parallel,
   an impedance value of the first current limiting unit and an impedance value of the second current limiting unit are changed by an electric current applied thereto,
   the applied electric current flows through the first current limiting unit when the applied electric current is less than the first threshold value,
   the applied electric current flows through the second current limiting unit and the second passive element when the applied electric current is equal to or higher than the first threshold value and less than the second threshold value, and
   the applied electric current flows through the passive element unit when the applied electric current is equal to or higher than the second threshold value.

2. The current limiting device of claim 1,
   wherein the first current limiting unit comprises a first switching element and a first current detecting element connected to the first switching element in series,
   the second current limiting unit comprises a second switching element and a second current detecting element connected to the second switching element in series, and
   the first switching element and the second switching element are turned ON or OFF based on electric current values detected by the first current detecting element and the second current detecting element, respectively.

3. The current limiting device of claim 1,
   wherein the first current limiting unit comprises a first superconducting element, and
   the second current limiting unit comprises a second superconducting element.

4. The current limiting device of claim 2,
   wherein the first current limiting unit sets the first switching element to be in an ON state when the electric current less than the first threshold value is applied.

5. The current limiting device of claim 2,
   wherein the first current limiting unit sets the first switching element to be in an OFF state when the electric current equal to or higher than the first threshold value and less than the second threshold value is applied, and
   the second current limiting unit sets the second switching element to be in an ON state when the electric current equal to or higher than the first threshold value and less than the second threshold value is applied.

6. The current limiting device of claim 2,
   wherein the first current limiting unit sets the first switching element to be in an OFF state when the electric current equal to or higher than the second threshold value is applied, and
   the second current limiting unit sets the second switching element to be in an OFF state when the electric current equal to or higher than the second threshold value is applied.

7. The current limiting device of claim 3,
   wherein when the electric current less than the first threshold value is applied, the electric current flows through the first super conducting device.

8. The current limiting device of claim 3,
   wherein when the electric current equal to or higher than the first threshold value and less than the second threshold value is applied, the first current limiting unit is blocked due to an increase of a resistance of the first superconducting element, and the electric current flows through the second current limiting unit and the second passive element.

9. The current limiting device of claim 3,
wherein when the electric current equal to or higher than the second threshold value is applied, the first current limiting unit and the second current limiting unit are blocked due to an increase of resistances of the first superconducting element and the second superconducting element, respectively, and the electric current flows through the passive element unit.

* * * * *